(12) United States Patent
Takeuchi et al.

(10) Patent No.: US 11,715,437 B2
(45) Date of Patent: Aug. 1, 2023

(54) LIQUID CRYSTAL DISPLAY DEVICE

(71) Applicant: Sharp Display Technology Corporation, Kameyama (JP)

(72) Inventors: Yohei Takeuchi, Kameyama (JP); Akira Tagawa, Kameyama (JP); Yasuaki Iwase, Kameyama (JP); Jun Nishimura, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 17/750,449

(22) Filed: May 23, 2022

(65) Prior Publication Data

US 2022/0406267 A1 Dec. 22, 2022

(30) Foreign Application Priority Data

Jun. 18, 2021 (JP) .................. 2021-101312

(51) Int. Cl.
*G09G 3/36* (2006.01)
*G11C 19/28* (2006.01)

(52) U.S. Cl.
CPC ......... *G09G 3/3677* (2013.01); *G09G 3/3688* (2013.01); *G09G 2300/0408* (2013.01); *G09G 2300/0469* (2013.01); *G09G 2310/0286* (2013.01); *G09G 2310/0297* (2013.01); *G09G 2320/045* (2013.01); *G11C 19/28* (2013.01)

(58) Field of Classification Search
CPC ......... G09G 3/3677; G09G 2310/0286; G09G 2300/0408; G09G 2300/0469; G09G 2310/0297; G09G 2320/045; G09G 3/3688; G11C 19/28
See application file for complete search history.

(56) References Cited

U.S. PATENT DOCUMENTS

| | | | |
|---|---|---|---|
| 2012/0062527 A1* | 3/2012 | Cheong | G02F 1/1347 345/204 |
| 2012/0218175 A1 | 8/2012 | Uemura et al. | |
| 2017/0343839 A1* | 11/2017 | Nam | G09G 3/3655 |
| 2018/0059459 A1* | 3/2018 | Park | G02F 1/13454 |
| 2018/0059465 A1* | 3/2018 | Kou | G09G 3/3648 |
| 2018/0081229 A1* | 3/2018 | Ono | G09G 3/3611 |
| 2018/0151103 A1* | 5/2018 | Kou | G09G 3/3648 |
| 2018/0164622 A1* | 6/2018 | Ono | G02F 1/136286 |
| 2018/0210247 A1* | 7/2018 | Ono | G02F 1/136286 |
| 2018/0286325 A1* | 10/2018 | Kou | G09G 3/3688 |
| 2018/0286340 A1* | 10/2018 | Tanaka | G09G 3/3677 |
| 2019/0064559 A1* | 2/2019 | Harada | G09G 3/3677 |
| 2020/0264469 A1* | 8/2020 | Nakanishi | G02F 1/1339 |
| 2021/0193006 A1* | 6/2021 | Wang | G09G 3/3677 |

FOREIGN PATENT DOCUMENTS

| | | |
|---|---|---|
| JP | 2002-122884 A | 4/2002 |
| JP | 2012-194530 A | 10/2012 |

* cited by examiner

*Primary Examiner* — Adam J Snyder
(74) *Attorney, Agent, or Firm* — Keating & Bennett, LLP

(57) ABSTRACT

A light control panel including an image display region including a region corresponding to an image display region in a display panel and a region corresponding to a peripheral circuit region in the display panel is provided between the display panel and a backlight. A pattern image for controlling radiation of light emitted from the backlight to the display panel is displayed in the image display region in the light control panel according to an action state of the peripheral circuit in the display panel.

17 Claims, 21 Drawing Sheets

LIQUID CRYSTAL DISPLAY DEVICE

CROSS-REFERENCE TO RELATED APPLICATIONS

This application claims the benefit of priority to Japanese Patent Application Number 2021-101312 filed on Jun. 18, 2021. The entire contents of the above-identified application are hereby incorporated by reference.

BACKGROUND

Technical Field

The following disclosure relates to a transmissive liquid crystal display device including a backlight on a back face of a panel.

Liquid crystal display devices are roughly classified into a transmissive type and a reflective type. A transmissive liquid crystal display device includes a backlight on a back face of a panel, and a user of the liquid crystal display device recognizes light transmitted through the liquid crystal from the backlight. A reflective liquid crystal display device includes no backlight, and a user of the reflective liquid crystal display device recognizes reflected light of external light (such as sunlight). The transmissive liquid crystal display device is mainly used for a device to be used indoors, and the reflective liquid crystal display device is mainly used for a device to be used outdoors. Also, a known transflective liquid crystal display device switches between use and non-use of light from a backlight according to a use environment.

In recent years, as for a liquid crystal display device, a circuit for controlling to drive various wiring lines in an image display region (a region to be actually used for image display of regions on a panel) referred to as an "active area" and supply a signal to the various wiring lines in the image display region, the circuit being provided in a peripheral portion of the image display region (hereinafter, simply referred to as a "peripheral circuit") is sometimes formed directly on a substrate constituting the panel (that is, monolithically formed). Typically, a monolithic configuration is often adopted for a gate driver (scanning signal line drive circuit) that drives a gate bus line (scanning signal line) disposed in the image display region.

Making the peripheral circuit monolithic as described above enables, for example, low costs and miniaturization of the entire device with reduction of the number of required IC chips.

In relation to this matter, JP 2012-194530 A discloses an invention of an image display device that controls turning on and off of a backlight in accordance with a response start timing and a response end timing of a display panel when input image data changes. Further, JP 2002-122884 A discloses an invention that can independently optimize an on-current and an off-current of a thin film transistor (TFT) by providing a variable coloration layer between an active layer of the thin film transistor and a TFT substrate.

SUMMARY

Unfortunately, a thin film transistor in a monolithic peripheral circuit typically changes its characteristics due to a long period of use (deteriorates its capability due to aging). For example, a threshold shift (change in threshold voltage) of the thin film transistor occurs according to a voltage applied to a gate of a thin film transistor. The threshold shift occurred changes an on-current and an off-current of the thin film transistor. This may result in the action abnormality of the device, for example. Thus, suppressing changes in the characteristics and improving the capability of such a thin film transistor is awaited.

As described above, JP 2012-194530 A describes controlling the turning on and off of the backlight according to the input image data. As will be described later, when light is radiated to a thin film transistor, the on-current of the thin film transistor increases, but the invention described in JP 2012-194530 A cannot radiate light to only a partial region where a circuit element is provided. Further, as described above, JP 2002-122884 A describes providing the variable coloration layer to allow for independently optimizing the on-current and the off-current of the thin film transistor. Unfortunately, due to the wavelength dependency of a transmittance, turning on and off of light cannot be controlled for all wavelengths.

Thus, an object of the disclosure is to implement a liquid crystal display device capable of improving a capability of a transistor (typically, a thin film transistor) in a monolithic peripheral circuit and suppressing a change in characteristics of the transistor.

(1) A liquid crystal display device according to some embodiments of the disclosure includes a display panel and a backlight provided at a back face side of the display panel.

The display panel includes
an actual image display region on which an actual image is displayed, and
a peripheral circuit region including a peripheral circuit configured to cause a circuit in the actual image display region to operate such that the actual image is displayed on the actual image display region.

The peripheral circuit is formed directly on a substrate constituting the display panel.

A light control panel including a pattern image display region is provided between the display panel and the backlight, the pattern image display region being a region including a first region corresponding to the actual image display region and a second region corresponding to the peripheral circuit region and a region on which a pattern image configured to control radiation of light emitted from the backlight to the display panel is displayed.

(2) Further, the liquid crystal display device according to some embodiments of the disclosure includes the configuration of (1) described above, and
in the first region, white display is performed such that the light emitted from the backlight is radiated to the entirety of the actual image display region,
in the second region, white display is performed in a partial region of the peripheral circuit region such that the light emitted from the backlight is radiated to only the partial region, and black display is performed in a region other than the partial region, and
the partial region where the white display is performed and the region where the black display is performed in the second region change according to an action state of the peripheral circuit.

(3) Further, the liquid crystal display device according to some embodiments of the disclosure includes the configuration of (1) or (2) described above,
the peripheral circuit region includes a plurality of light radiation target regions, and
the pattern image to be displayed on the pattern image display region changes according to the action state of the peripheral circuit such that the light emitted from the backlight is sequentially radiated to the plurality of light radiation target regions.

(4) Further, the liquid crystal display device according to some embodiments of the disclosure includes the configuration of (3) described above, and each of the plurality of light radiation target regions is a region including a transistor.

(5) Further, the liquid crystal display device according to some embodiments of the disclosure includes the configuration of (4) described above, the actual image display region includes a plurality of scanning signal lines, the peripheral circuit region includes, as the peripheral circuit, a scanning signal line drive circuit that is configured by a shift register formed of a plurality of stages corresponding one-to-one to the plurality of scanning signal lines and is configured to drive the plurality of scanning signal lines, a unit circuit constituting each of the plurality of stages of the shift register includes a plurality of transistors, and each of the plurality of light radiation target regions is a region including a predetermined transistor of the plurality of transistors included in the unit circuit.

(6) Further, the liquid crystal display device according to some embodiments of the disclosure includes the configuration of (5) described above, the shift register operates in response to a plurality of clock signals, the unit circuit includes an output node connected to a corresponding scanning signal line of the plurality of scanning signal lines, an output control transistor including a control terminal, a first conduction terminal to be provided with one of the plurality of clock signals, and a second conduction terminal connected to the output node, an output control node connected to the control terminal of the output control transistor, an output control node set section configured to set the output control node to an on level in response to an output signal output from the unit circuit constituting a preceding stage of the plurality of stages and an output control node reset section configured to set the output control node to an off level in response to an output signal output from the unit circuit constituting a succeeding stage of the plurality of stages and each of the plurality of light radiation target regions is a region including the output control transistor.

(7) Further, the liquid crystal display device according to some embodiments of the disclosure includes the configuration of (6) described above, and the pattern image is displayed on the pattern image display region such that in each unit circuit, the light emitted from the backlight is radiated to the region including the output control transistor in a period when a corresponding scanning signal line of the plurality of scanning signal lines is to be charged and a period when the corresponding scanning signal line is to be discharged in a period when the output control node is maintained at the on level.

(8) Further, the liquid crystal display device according to some embodiments of the disclosure includes the configuration of (4) described above, the actual image display region includes a plurality of video signal lines, the display panel includes a video signal line drive circuit configured to output, in a time-division manner, a video signal to a data output line corresponding to each video signal line group obtained by grouping the plurality of video signal lines into video signal line groups with K number of video signal lines as one set (K is an integer of 2 or greater), the peripheral circuit region includes, as the peripheral circuit, a connection switching circuit configured to switch, in a time-division manner, a connection destination of the data output line corresponding to each video signal line group among the K number of video signal lines constituting each video signal line group, the connection switching circuit includes first to K-th connection control transistors configured to control a connection state between the data output line corresponding to each video signal line group and each of the K number of video signal lines, the plurality of light radiation target regions includes first to K-th light radiation target regions, and the first to K-th light radiation target regions are regions including the first to K-th connection control transistors, respectively.

(9) Further, the liquid crystal display device according to some embodiments of the disclosure includes the configuration of (8) described above, and the pattern image is displayed on the pattern image display region such that the light emitted from the backlight is radiated to a region including a connection control transistor that is in an off state of the first to K-th connection control transistors, and the light emitted from the backlight is not radiated to a region including a connection control transistor that is in an on state of the first to K-th connection control transistors.

(10) Further, the liquid crystal display device according to some embodiments of the disclosure further includes, in addition to any one of the configurations of (1) to (9) described above, a light control panel drive circuit configured to cause a circuit in the pattern image display region to operate such that the pattern image is displayed on the pattern image display region, and an action of the peripheral circuit and an action of the light control panel drive circuit are controlled by the same control circuit.

According to the liquid crystal display device according to some embodiments of the disclosure, the light control panel is provided between the display panel that displays an actual image and the backlight. The light control panel includes the pattern image display region including the first region corresponding to the actual image display region in the display panel and the second region corresponding to the peripheral circuit region in the display panel, and the pattern image is displayed on the pattern image display region, and thus the radiation of light emitted from the backlight to the display panel is controlled. Changing the pattern image to be displayed on the pattern image display region according to the action state of the peripheral circuit allows, for example, an on-current to be increased by radiating light to a predetermined transistor when the predetermined transistor is in an on state, and an increase in threshold shift in a positive direction to be suppressed by radiating light to a transistor when a negative voltage is applied to a gate of the transistor. As described above, the liquid crystal display device capable of improving the capability of the transistor in the monolithic peripheral circuit and suppressing changes in characteristics of the transistor is implemented.

BRIEF DESCRIPTION OF DRAWINGS

The disclosure will be described with reference to the accompanying drawings, wherein like numbers reference like elements.

DESCRIPTION OF EMBODIMENTS

1. Overview

Figure 1:
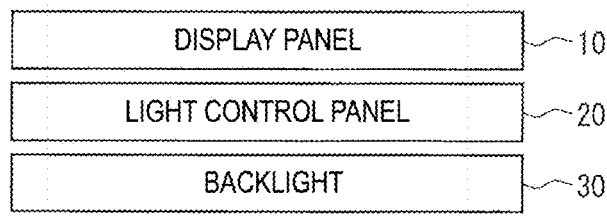
FIG. 1 is a schematic side view of a liquid crystal display device according to all embodiments.

Before embodiments are explained, an overview of the disclosure will be described. A typical liquid crystal display device includes a liquid crystal panel for displaying an image, and a backlight that radiates light to the liquid crystal panel from a back face thereof. In contrast, a liquid crystal display device according to each of the embodiments, which will be described below, schematically includes a display panel 10, a light control panel 20, and a backlight 30 as illustrated in FIG. 1. Note that FIG. 1 is a side view of the liquid crystal display device. As can be seen from FIG. 1, the light control panel 20 is provided between the display panel 10 and the backlight 30.

The display panel 10 is a liquid crystal panel for displaying an actual image, which is an image to be actually viewed by a user. In other words, the display panel 10 has functions similar to those of a display panel (liquid crystal panel) provided in a typical liquid crystal display device. The light control panel 20 is a liquid crystal panel for controlling radiation of light (light from the backlight) to the display panel 10. More specifically, the light control panel 20 is a liquid crystal panel for controlling the radiation of the light to a peripheral circuit region (a circuit region provided around an image display region) in the display panel 10. In this regard, the light control panel 20 displays a pattern image corresponding to an action state of the peripheral circuit. This controls transmission or blocking of light for each pixel region in the light control panel 20. In this way, radiation of light to the peripheral circuit region in the display panel 10 is controlled. The backlight 30 radiates light to the light control panel 20 from a back face thereof. The light emitted from the backlight 30 is radiated through the light control panel 20 to the display panel 10 from the back face thereof.

Figure 2:
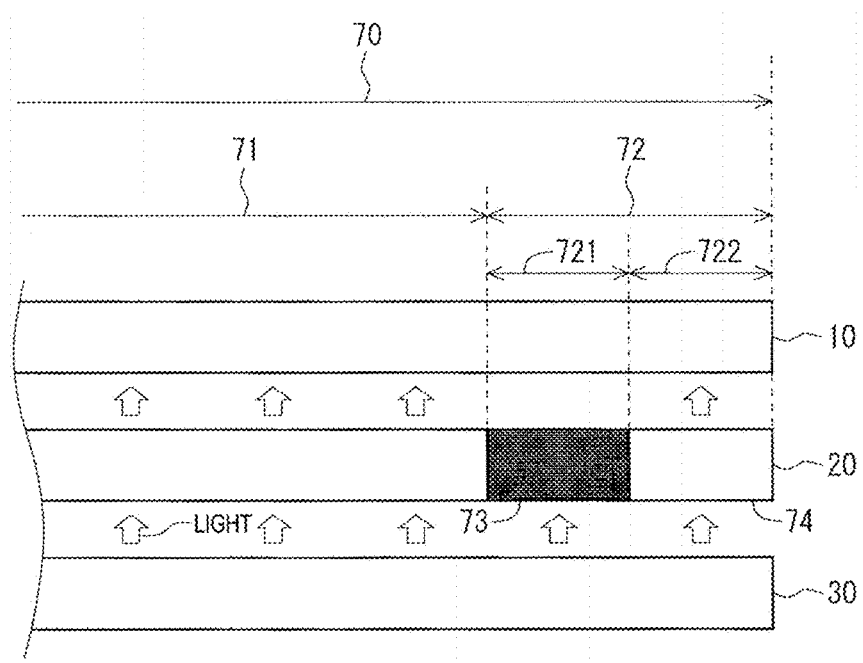
FIG. 2 is a diagram schematically illustrating a state of the liquid crystal display device at a certain time point for all the embodiments.

FIG. 2 is a diagram schematically illustrating a state of the liquid crystal display device at a certain time point. In FIG. 2, a region represented by an arrow denoted by a reference sign 70 corresponds to the image display region (an active area) in the light control panel 20, a region represented by an arrow denoted by a reference sign 71 corresponds to an image display region (an active area) in the display panel 10, and a region represented by an arrow denoted by a reference sign 72 corresponds to the peripheral circuit region of the display panel 10. In the light control panel 20, it is assumed that black display is performed in a region denoted by a reference sign 73 at a certain time point, and white display is performed in a region denoted by a reference sign 74. Light is blocked in the region where the black display is performed, and light is transmitted in the region where the white display is performed. Thus, at this time, regarding the peripheral circuit region of the display panel 10, light is not radiated to a region denoted by a reference sign 721 but is radiated to a region denoted by a reference sign 722. As described above, in a region corresponding to the peripheral circuit region in the display panel 10 in a region in the light control panel 20, the white display is performed in a partial region such that light emitted from the backlight 30 is radiated only a partial region in the peripheral circuit region, and the black display is performed in the a region other than the partial region. However, the region where the white display is performed and the region where the black display is performed change depending on an action state of the peripheral circuit. Note that in each embodiment that will be described below, in the region corresponding to the image display region in the display panel 10 of the regions in the light control panel 20, the white display is performed throughout an action period of the liquid crystal display device such that the light emitted from the backlight 30 is radiated to the entirety of the image display region in the display panel 10. Thus, providing the light control panel 20 does not affect the display of an actual image.

The embodiments will be described below. Each embodiment including an example in which an n-channel thin film transistor is employed will be described. Regarding the example, of a drain and a source of the n-channel thin film transistor, the drain is a portion having a higher potential. However, in some thin film transistors of the thin film transistors used in the following embodiments, the drain and the source are switched during the action. Thus, in the following description, one of two terminals that function as the drain and the source is referred to as a "first conduction terminal" and the other one thereof is referred to as a "second conduction terminal." Further, a terminal that functions as a gate of the thin film transistor is referred to as a "control terminal."

2. First Embodiment

2.1 Overall Configuration and Action

Figure 3:
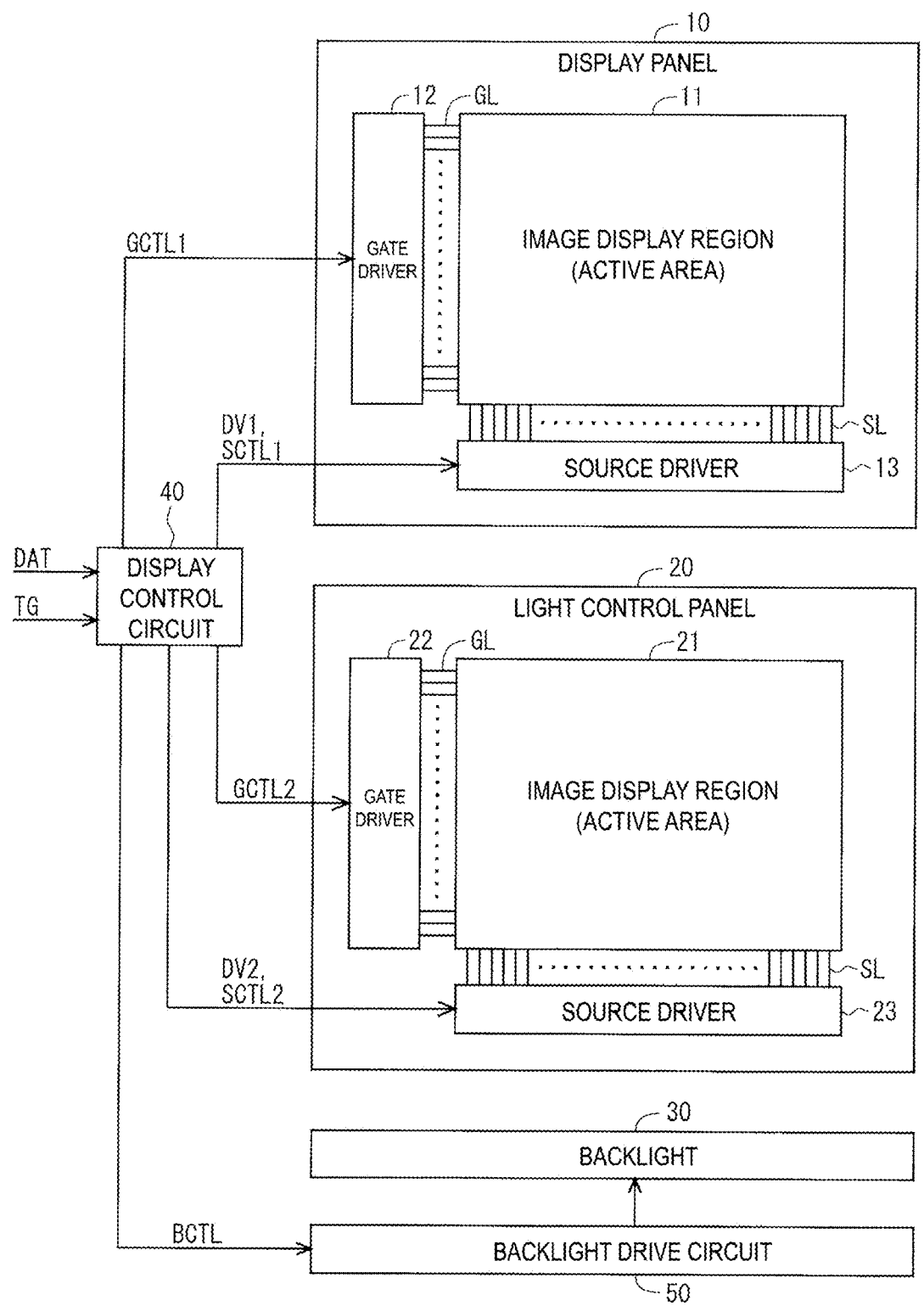
FIG. 3 is a block diagram illustrating a functional configuration of the liquid crystal display device according to a first embodiment.

FIG. 3 is a block diagram illustrating a functional configuration of a liquid crystal display device according to a first embodiment. Note that FIG. 3 is a diagram illustrating the functional configuration, and thus positional relationships among constituent elements and the like are different from actual states. As illustrated in FIG. 3, the liquid crystal display device includes the display panel 10, the light control panel 20, the backlight 30, a display control circuit 40, and a backlight drive circuit 50. The display panel 10 is a liquid crystal panel for displaying an actual image as described above and includes an image display region (active area) 11, a gate driver 12, and a source driver 13. The light control panel 20 is a liquid crystal panel for controlling a radiation of light (light from the backlight) to the display panel 10 as described above and includes an image display region (active area) 21, a gate driver 22, and a source driver 23. Circuits in the image display region 11 and the gate driver 12 are integrally formed on a substrate constituting the display panel 10. That is, the gate driver 12 is formed to be monolithic. The source driver 13 is provided, for example, in a form of an IC chip in a frame region on the substrate constituting the display panel 10. The gate driver 22 in the light control panel 20 may be formed to be monolithic or non-monolithic. The source driver 23 is provided, for example, in a form of an IC chip in a frame region on a substrate constituting the light control panel 20. Note that an actual image display region is implemented by the image display region 11 in the display panel 10, and a pattern image display region is implemented by the image display region 21 in the light control panel 20.

Figure 4:
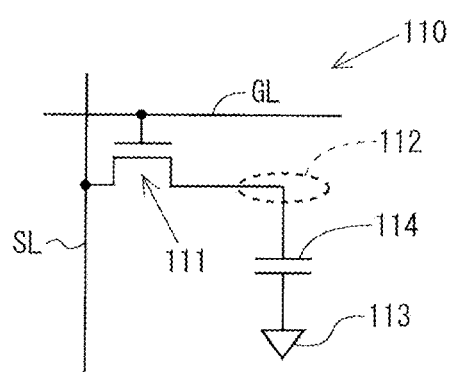
FIG. 4 is a circuit diagram illustrating a configuration of a pixel forming section according to the first embodiment.

A plurality of gate bus lines GL and a plurality of source bus lines SL are disposed in the image display region 11 in the display panel 10. The image display region 11 is further provided with a pixel forming section that forms a pixel corresponding to each intersection of a gate bus line GL of the plurality of gate bus lines GL with a source bus line SL of the plurality of source bus lines SL. In other words, the image display region 11 includes a plurality of the pixel forming sections. The plurality of the pixel forming sections is arranged in a matrix shape to form a pixel array. As illustrated in FIG. 4, each pixel forming section 110 includes a thin film transistor 111 including a control terminal connected to the gate bus line GL passing through the corresponding intersection and a first conduction terminal connected to the source bus line SL passing through the corresponding intersection, a pixel electrode 112 connected to a second conduction terminal of the thin film transistor 111, a common electrode 113 to which a constant voltage is to be applied, and a liquid crystal capacitance 114 formed by the pixel electrode 112 and the common electrode 113. Note that an auxiliary capacitance may sometimes be provided in parallel with the liquid crystal capacitance 114.

In the image display region 21 in the light control panel 20, a plurality of gate bus lines GL and a plurality of source bus lines SL are also disposed. Note that in FIG. 3, the gate bus line in the display panel 10 and the gate bus line in the light control panel 20 are denoted by the same reference sign GL for convenience. Similarly, the source bus line in the display panel 10 and the source bus line in the light control panel 20 are denoted by the same reference sign SL.

Figure 5:
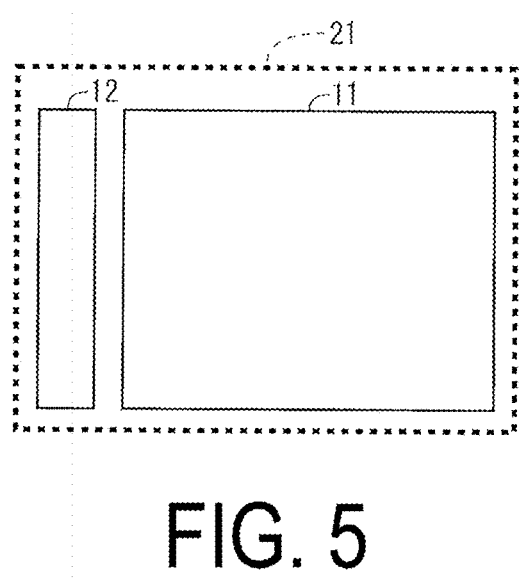
FIG. 5 is a diagram for describing an image display region in a light control panel in the first embodiment.

In the present embodiment, as illustrated in FIG. 5, the image display region 21 in the light control panel 20 includes a region corresponding to the image display region 11 in the display panel 10 and a region corresponding to a region where the gate driver 12 is formed in the display panel 10. Note that a first region is implemented by the region corresponding to the image display region 11 in the display panel 10, and a second region is implemented by the region corresponding to the region where the gate driver 12 is formed in the display panel 10. Additionally, a peripheral circuit region is implemented by the region where the gate driver 12 is formed in the display panel 10.

Actions of the constituent elements illustrated in FIG. 3 will be described below.

The display control circuit 40 receives an image signal DAT and a timing signal group TG including a horizontal synchronization signal or a vertical synchronization signal to be sent from the outside, and outputs a gate control signal GCTL1 for controlling an action of the gate driver 12, a source control signal SCTL1 for controlling an action of the source driver 13, a digital video signal DV1 for displaying an actual image, a gate control signal GCTL2 for controlling an action of the gate driver 22, a source control signal SCTL2 for controlling an action of the source driver 23, a digital video signal DV2 for displaying a pattern image, and a backlight control signal BCTL for controlling an action of the backlight drive circuit 50. The gate control signal GCTL1 and the gate control signal GCTL2 include a gate start pulse signal, a gate end pulse signal, and a gate clock signal. The source control signal SCTL1 and the source control signal SCTL2 include a source start pulse signal, a source clock signal, and a latch strobe signal.

The gate driver 12 applies, in response to the gate control signal GCTL1 output from the display control circuit 40, an active scanning signal to each gate bus line GL in the image display region 11 repeatedly with a cycle of one vertical scanning period. The gate driver 12 will be described below in detail.

The source driver 13 applies, in response to the digital video signal DV1 for displaying an actual image and the source control signal SCTL1 to be output from the display control circuit 40, a video signal for driving to each source bus line SL in the image display region 11.

The gate driver 22 applies, in response to the gate control signal GCTL2 output from the display control circuit 40, an active scanning signal to each gate bus line GL in the image display region 21 repeatedly with a cycle of one vertical scanning period.

The source driver 23 applies, in response to the digital video signal DV2 for displaying a pattern image and the source control signal SCTL2 to be output from the display control circuit 40, a video signal for driving to each source bus line SL in the image display region 21.

The backlight drive circuit 50 controls a lighting state of the backlight 30 in response to the backlight control signal BCTL output from the display control circuit 40. The backlight 30 radiates light to the light control panel 20 from the back face thereof in accordance with the control by the backlight drive circuit 50. The light transmitted through the light control panel 20 is radiated to the display panel 10 from the back face thereof. That is, as described above, the light emitted from the backlight 30 is radiated through the light control panel 20 to the display panel 10 from the back face thereof.

As described above, a pattern image is displayed on the image display region 21 in the light control panel 20 by applying a scanning signal to each gate bus line GL in the light control panel 20 and applying a video signal for driving to each source bus line SL in the light control panel 20 with light being emitted from the backlight 30. According to the pattern image displayed on this manner on the image display region 21 in the light control panel 20, the light emitted from the backlight 30 is radiated to the back face of the display panel 10. By applying a scanning signal to each gate bus line GL in the display panel 10 and applying a video signal for driving to each source bus line SL in the display panel 10 in such a state, an image based on the image signal DAT sent from the outside is displayed on the image display region 11 in the display panel 10.

2.2 Gate Driver

Figure 6:
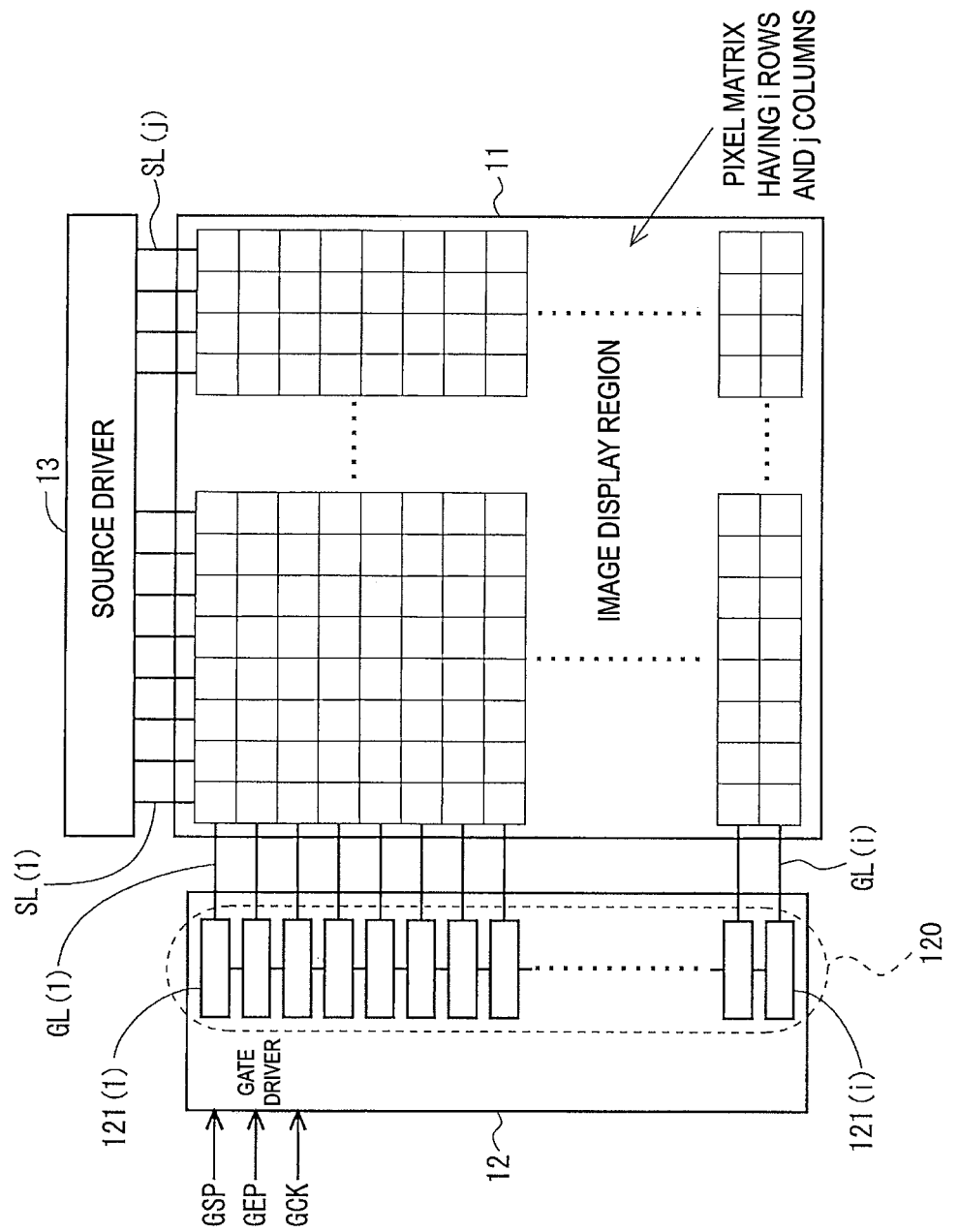
FIG. 6 is a diagram for describing a schematic configuration of a gate driver in the first embodiment.

Next, a configuration and an action of the gate driver 12 in the display panel 10 will be described with reference to FIG. 6 to FIG. 10. As illustrated in FIG. 6, the gate driver 12 includes a shift register 120 having a plurality of stages. The image display region 11 forms a pixel matrix having i rows and j columns, and each stage of the shift register 120 is provided corresponding one-to-one to each row of the pixel matrix. Hereinafter, a circuit constituting each stage of the shift register 120 is referred to as a "unit circuit." As described above, each stage of the shift register 120 is provided corresponding one-to-one to each row of the pixel matrix, and thus the shift register 120 includes i number of unit circuits 121(1) to 121(i). However, a dummy unit circuit constituting a stage before the first stage or a stage after the i-th stage may be provided.

Figure 7:
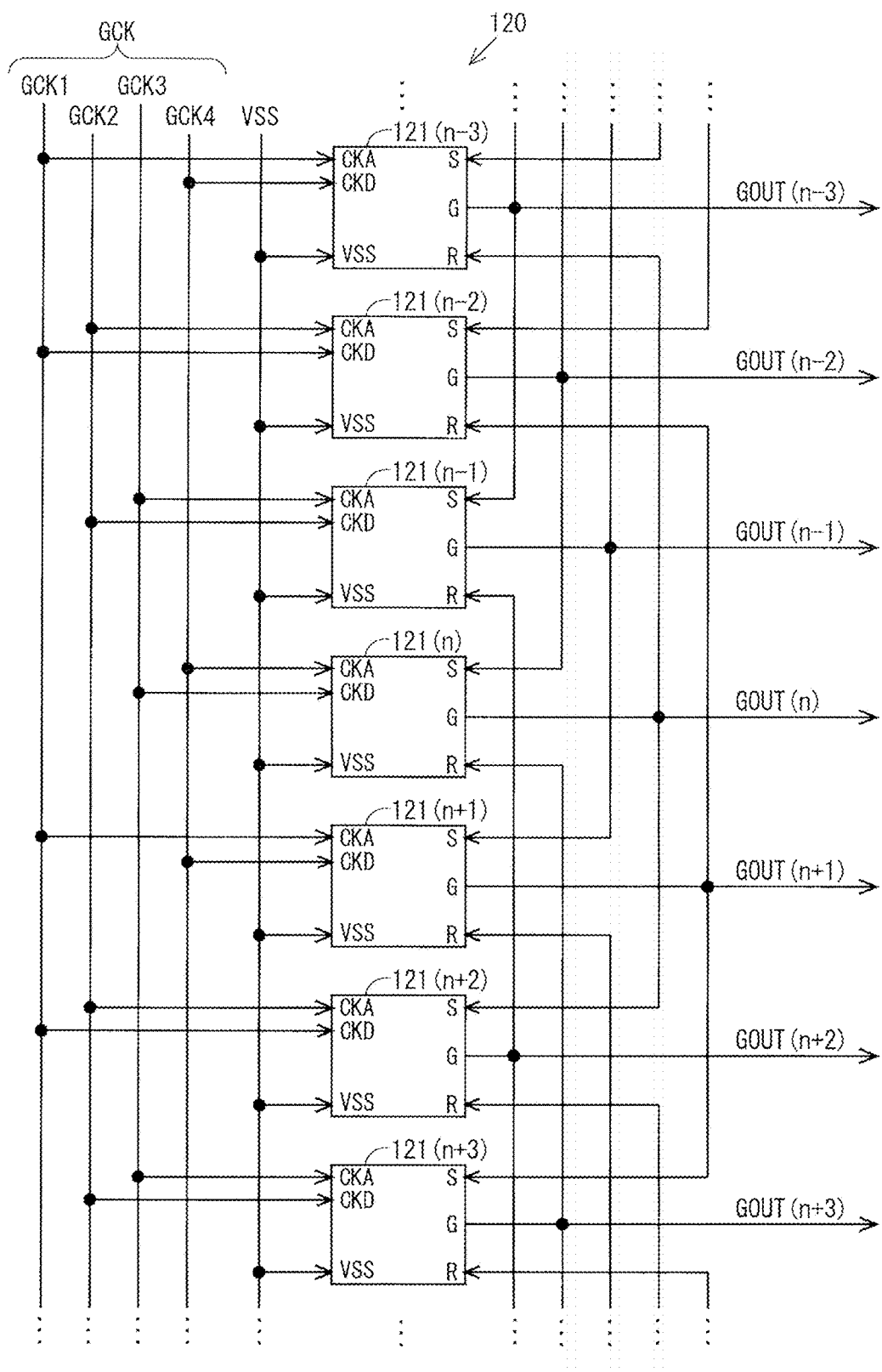
FIG. 7 is a block diagram illustrating a configuration of a shift register implementing the gate driver in the first embodiment.

FIG. 7 is a block diagram illustrating a configuration of the shift register 120. However, FIG. 7 illustrates only the unit circuits 121(n−3) to 121(n+3) from the (n−3)-th stage to the (n+3)-th stage, where n is a multiple of 4. Each unit circuit 121 includes an input terminal for receiving a clock signal CKA, an input terminal for receiving a clock signal CKD, an input terminal for receiving a set signal S, an input terminal for receiving a reset signal R, an input terminal for receiving a low level of a power supply voltage VSS, and an output terminal for outputting an output signal G.

The shift register 120 is provided with a gate start pulse signal GSP (not illustrated in FIG. 7), a gate end pulse signal GEP (not illustrated in FIG. 7), and a gate clock signal GCK, as the gate control signal GCTL1. The shift register 120 is also provided with the low level of the power supply voltage VSS. The gate clock signal GCK includes four-phase clock signals GCK1 to GCK4. A phase of the clock signal GCK1 is 90 degrees ahead of a phase of the clock signal GCK2, the phase of the clock signal GCK2 is 90 degrees ahead of a phase of the clock signal GCK3, and the phase of the clock signal GCK3 is 90 degrees ahead of a phase of the clock signal GCK4 (see FIG. 8).

The unit circuit 121(n−3) at the (n−3)-th stage is provided with the clock signal GCK1 as the clock signal CKA and is provided with the clock signal GCK4 as the clock signal CKD. The unit circuit 121(n−2) at the (n−2)-th stage is provided with the clock signal GCK2 as the clock signal CKA and is provided with the clock signal GCK1 as the clock signal CKD. The unit circuit 121(n−1) at the (n−1)-th stage is provided with the clock signal GCK3 as the clock signal CKA and is provided with the clock signal GCK2 as the clock signal CKD. The unit circuit 121(n) at the n-th stage is provided with the clock signal GCK4 as the clock signal CKA and is provided with the clock signal GCK3 as the clock signal CKD. At the first to i-th stages, configurations similar to those of the four stages described above are repeated.

In addition, the unit circuit 121 at each stage is provided with the output signal G from the unit circuit 121 at the stage before two stages as the set signal S, and is provided with the output signal G from the unit circuit 121 at the stage after three stages as the reset signal R. However, the unit circuits 121(1) and 121(2) at the first stage and the second stage are provided with, for example, the gate start pulse signal GSP or the output signal G from the dummy unit circuit 121 provided before the first stage as the set signal S. Additionally, the unit circuits 121(i−2), 121(i−1), and 121(i) at the stage (i−2)-th stage, (i−1)-th stage, and the i-th stage, respectively, are provided with, for example, the gate end pulse signal GEP or the output signal G from the dummy unit circuit 121 provided after the i-th stage as the reset signal R. Note that the low level of the power supply voltage VSS is provided commonly to all of the unit circuits 121.

Figure 8:
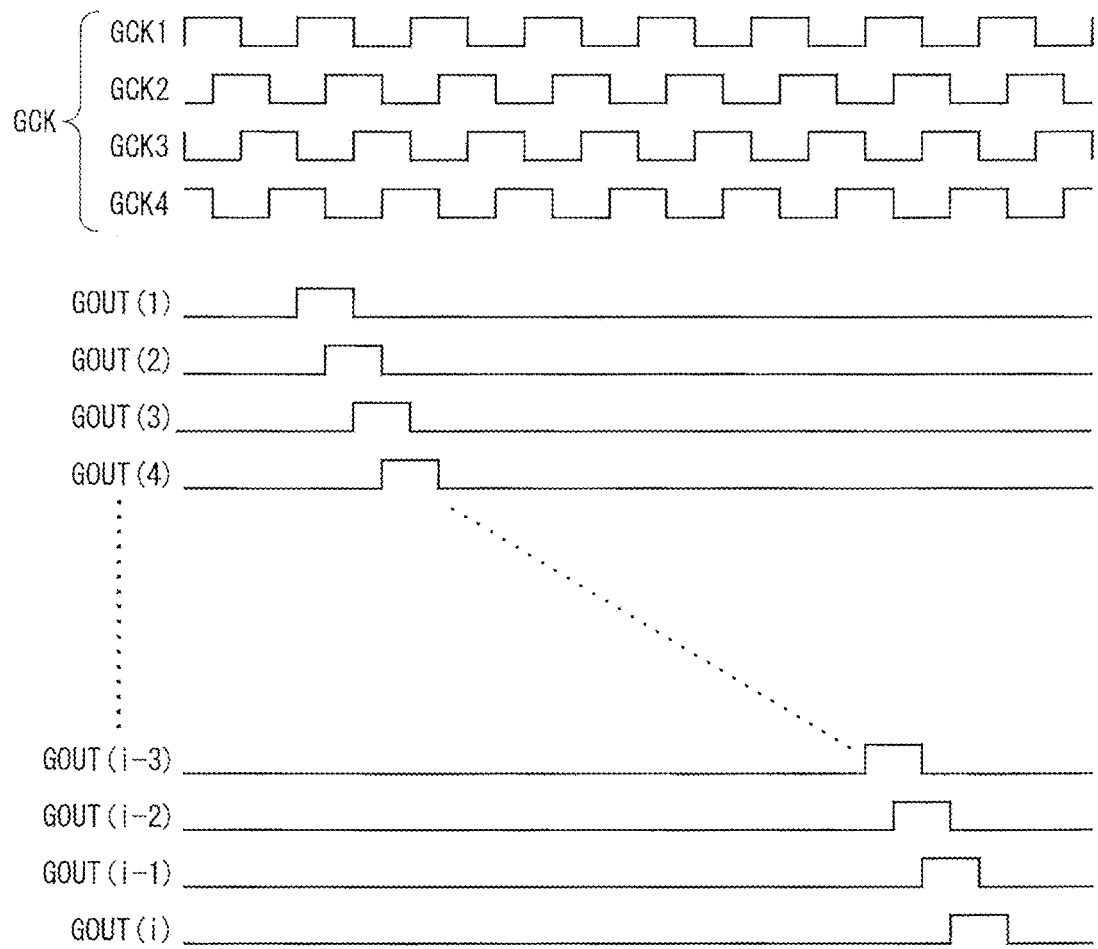
FIG. 8 is a signal waveform diagram for describing an action of the shift register in the first embodiment.

In the above-described configuration, when the shift register 120 is provided with a pulse of the gate start pulse signal GSP, based on the four-phase clock signals GCK1 to GCK4 described above, a pulse is sequentially transferred from the unit circuit 121(1) at the first stage to the unit circuit 121(i) at the i-th stage. In response to the transfer of the pulse, the output signals G sequentially become a high level in the unit circuits 121(1) to 121(i) at the first to i-th stages. The output signals G from the unit circuits 121(1) to 121(i) at the first to i-th stages are respectively provided to the gate bus lines GL(1) to GL(i) at the first to i-th rows as the scanning signals GOUT(1) to GOUT(i). As a result, as illustrated in FIG. 8, the scanning signals GOUT(1) to GOUT(i) that sequentially become the high level for a predetermined period are provided to the gate bus lines GL(1) to GL(i) disposed in the image display region 11, respectively.

Note that the above-described contents of the configuration of the shift register 120, the method of applying the clock signals CKA and CKD to each unit circuit 121, and the method of applying the set signal S to each unit circuit 121, and the method of applying the reset signal R to each unit circuit 121 are only an example and are not limited thereto.

Figure 9:
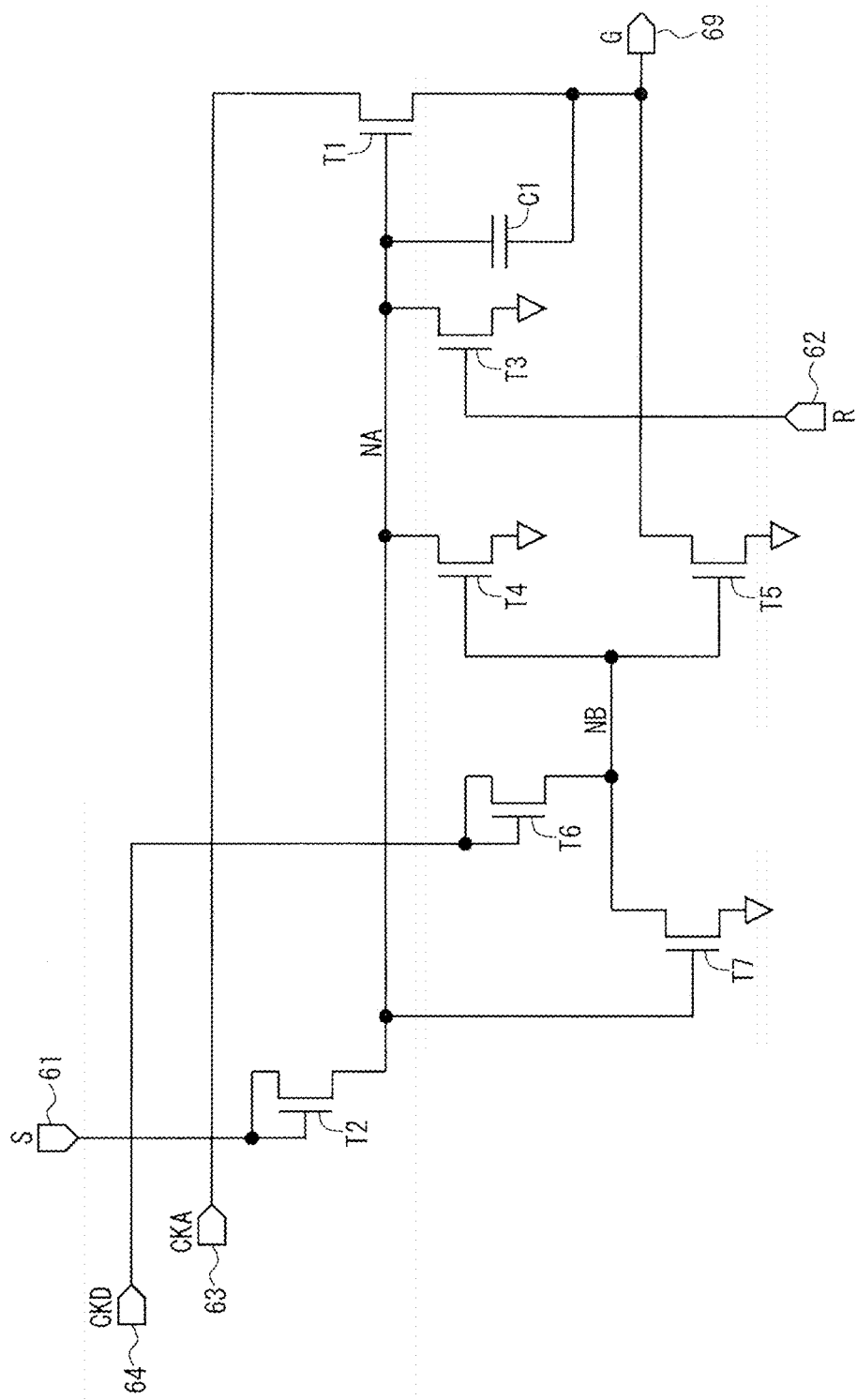
FIG. 9 is a circuit diagram illustrating a configuration example of a unit circuit included in the shift register in the first embodiment.

FIG. 9 is a circuit diagram illustrating a configuration of the unit circuit 121 included in the shift register 120 described above (a configuration of one stage in the shift register 120). Note that the configuration described hereinafter is merely an example, and no such limitation is intended. As illustrated in FIG. 9, the unit circuit 121 includes seven thin film transistors T1 to T7 and a single capacitor C1. Additionally, the unit circuit 121 includes four input terminals 61 to 64 and one output terminal (output node) 69, in addition to the input terminal for the low level of the power supply voltage VSS. Note that the input terminal that receives the set signal S is denoted by a reference sign 61, the input terminal that receives the reset signal R is denoted by a reference sign 62, the input terminal that receives the clock signal CKA is denoted by a reference sign 63, the input terminal that receives the clock signal CKD is denoted by a reference sign 64, and the output terminal that outputs the output signal G is denoted by a reference sign 69.

Next, a connection relationship between the constituent elements in the unit circuit 121 will be described. A control terminal of the thin film transistor T1, a second conduction terminal of the thin film transistor T2, a first conduction terminal of the thin film transistor T3, a first conduction terminal of the thin film transistor T4, a control terminal of the thin film transistor T7, and a first electrode of the capacitor C1 are connected to one another via a node NA. A control terminal of the thin film transistor T4, a control terminal of the thin film transistor T5, a second conduction terminal of the thin film transistor T6, and a first conduction terminal of the thin film transistor T7 are connected to one another via a node NB.

As for the thin film transistor T1, the control terminal is connected to the node NA, a first conduction terminal is connected to the input terminal 63, and a second conduction terminal is connected to the output terminal 69. As for the thin film transistor T2, a control terminal and a first conduction terminal are connected to the input terminal 61 (in other words, in a diode connection state), and the second conduction terminal is connected to the node NA. As for the thin film transistor T3, a control terminal is connected to the input terminal 62, the first conduction terminal is connected to the node NA, and a second conduction terminal is connected to the input terminal for the low level of the power supply voltage VSS. As for the thin film transistor 14, the control terminal is connected to the node NB, the first conduction terminal is connected to the node NA, and a second conduction terminal is connected to the input terminal for the low level of the power supply voltage VSS. As for the thin film transistor T5, the control terminal is connected to the node NB, a first conduction terminal is connected to the output terminal 69, and a second conduction terminal is connected to the input terminal for the low level of the power supply voltage VSS. As for the thin film transistor T6, a control terminal and a first conduction terminal are connected to the input terminal 64 (in other words, in a diode connection state), and the second conduction terminal is connected to the node NB. As for the thin film transistor T7, the control terminal is connected to the node NA, the first conduction terminal is connected to the node NB, and the second conduction terminal is connected to the input terminal for the low level of the power supply voltage VSS. For the capacitor C1, the first electrode is connected to the control terminal of the thin film transistor T1, and a second electrode is connected to the second conduction terminal of the thin film transistor T1.

Note that according to the present embodiment, the output control node is implemented by the node NA, the output control node set section is implemented by the thin film transistor T2, and the output control node reset section is implemented by the thin film transistor T3.

Figure 10:
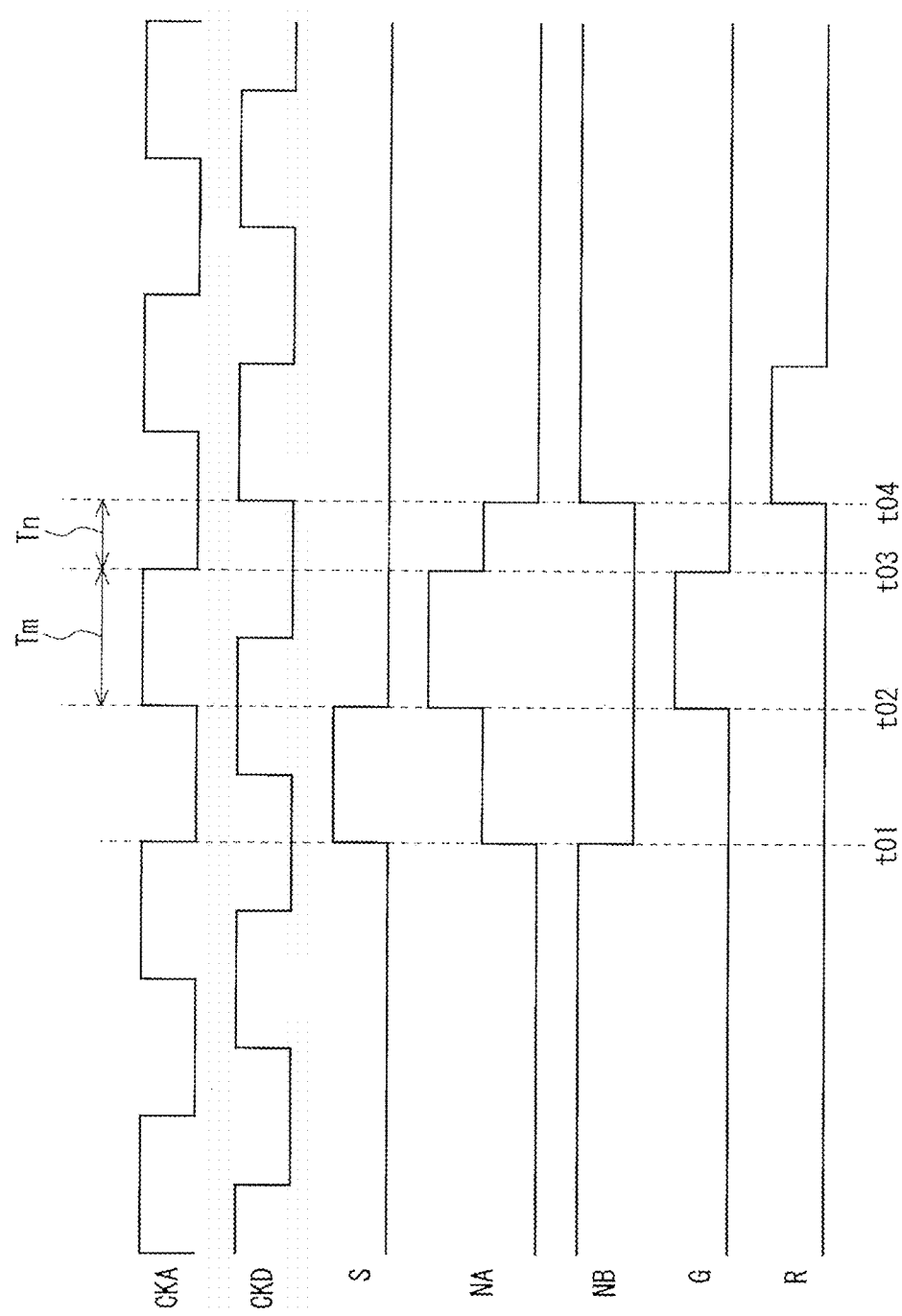
FIG. 10 is a signal waveform diagram for describing an action of the unit circuit in the first embodiment.

Next, an action of the unit circuit 121 will be described with reference to FIG. 9 and FIG. 10. Note that a period from a time point t02 to a time point t03 in FIG. 10 is assumed to be a period (select period) in which the gate bus line GL connected to the output terminal 69 of the unit circuit 121 is to be in a select state.

At a time point immediately before a time point t01, the set signal S, the output signal G, and the reset signal R are at a low level. Also, a potential of the node NA is at a low level, and a potential of the node NB is at a high level.

At the time point t01, a pulse of the set signal S is provided to the input terminal 61. Since the thin film transistor T2 has a configuration of diode connection, the capacitor C1 is charged by a pulse of the set signal S, and a potential of the node NA rises. This causes the thin film transistor T7 to enter an on state and a potential of the node NB to become a low level. As a result, the thin film transistor T4 and the thin film transistor T5 enter an off state.

At the time point t02, the clock signal CKA changes from a low level to a high level. At this time, since the thin film transistor T1 is in an on state, a potential of the output terminal 69 (a potential of the output signal G) rises along with the rise of a potential of the input terminal 63. When the potential of the output terminal 69 rises, the potential of the node NA also rises via the capacitor C1. As a result, a large voltage is applied to the control terminal of the thin film transistor T1, and the potential of the output signal G rises to a level sufficient to cause the gate bus line GL connected to the output terminal 69 of the unit circuit 121 to enter the select state. A state in which the clock signal CKA is at the high level is maintained until the time point t03, and thus, the output signal G is maintained at the high level during the period from the time point t02 to the time point t03. Thus, during this period, a video signal is written to the pixel forming section 110 connected to the gate bus line GL connected to the output terminal 69 of the unit circuit 121.

At the time point t03, the clock signal CKA changes from the high level to the low level. At this time, since the thin film transistor T1 is in the on state, the potential of the output terminal 69 (the potential of the output signal G) decreases along with the decrease of the potential of the input terminal 63. This causes the output signal G to become the low level. In addition, along with the decrease of the potential of the output terminal 69, the potential of the node NA also decreases through the capacitor C1.

At a time point t04, the reset signal R changes from a low level to a high level. This causes the thin film transistor T3 to enter an on state and the potential of the node NA to become the low level. As a result, the thin film transistor T7 enters an off state. Additionally, at the time point t04, the clock signal CKD changes from a low level to a high level. As described above, the thin film transistor T7 is in the off state, and the thin film transistor T6 has a configuration of diode connection, and thus the clock signal CKD changes from the low level to the high level to cause the potential of the node NB to become the high level. As a result, the thin film transistor T4 and the thin film transistor T5 enter an on state. This causes the thin film transistor 14 and the thin film transistor T5 to enter the on state, and thus the potential of the node NA and the output signal G are reliably maintained at the low level when noise occurs after the time point t04. This prevents an abnormal action from occurring.

2.3 Control of Light Control Panel

The thin film transistor T1 (see FIG. 9) in the unit circuit 121 is a transistor for supplying the scanning signal GOUT to the gate bus line GL in the display panel 10. Hereinafter, the thin film transistor T1 will be referred to as an "output control transistor." The output control transistor T1 is a transistor that is directly related to charging/discharging of the gate bus line GL. FIG. 8 and FIG. 10 illustrate an ideal waveform for each signal, but an actual waveform is blunted. When a waveform is assumed to be largely blunted at rising of the scanning signal GOUT, charging to the liquid crystal capacitance 114 (see FIG. 4) in the pixel forming section 110 may be insufficiently performed. In addition, when a waveform is assumed to be largely blunted at falling of the scanning signal GOUT, writing based on data of the following row may be performed on each pixel forming section 110. As described above, a large current drive capability is required for the output control transistor T1 such that the rising and falling of the scanning signal GOUT are rapidly performed.

In a period Tm in FIG. 10, a current flows from the input terminal 63 to the output terminal 69 such that the scanning signal GOUT (the output signal G from the unit circuit 121) changes from the low level to the high level. At this time, the larger the on-current of the output control transistor T1 is, the faster the scanning signal GOUT rises. In a period Tn in FIG. 10, a current flows from the output terminal 69 to the input terminal 63 such that the scanning signal GOUT changes from the high level to the low level. At this time, the larger the on-current of the output control transistor T1 is, the faster the scanning signal GOUT falls.

When light is radiated to a thin film transistor, an on-current of the thin film transistor increases. Thus, in the period Tm in FIG. 10, light is radiated to the output control transistor T1 by displaying a desired pattern image in the image display region 21 on the light control panel 20 such that the on-current of the output control transistor T1 increases and the scanning signal GOUT rapidly rises. In addition, in the period Tn in FIG. 10, light is radiated to the output control transistor T1 by displaying a desired pattern image on the image display region 21 in the light control panel 20 such that the on-current of the output control transistor T1 increases and the scanning signal GOUT rapidly falls. Note that in the present embodiment, a light radiation target region is implemented by the region including the output control transistor T1.

Figure 11:
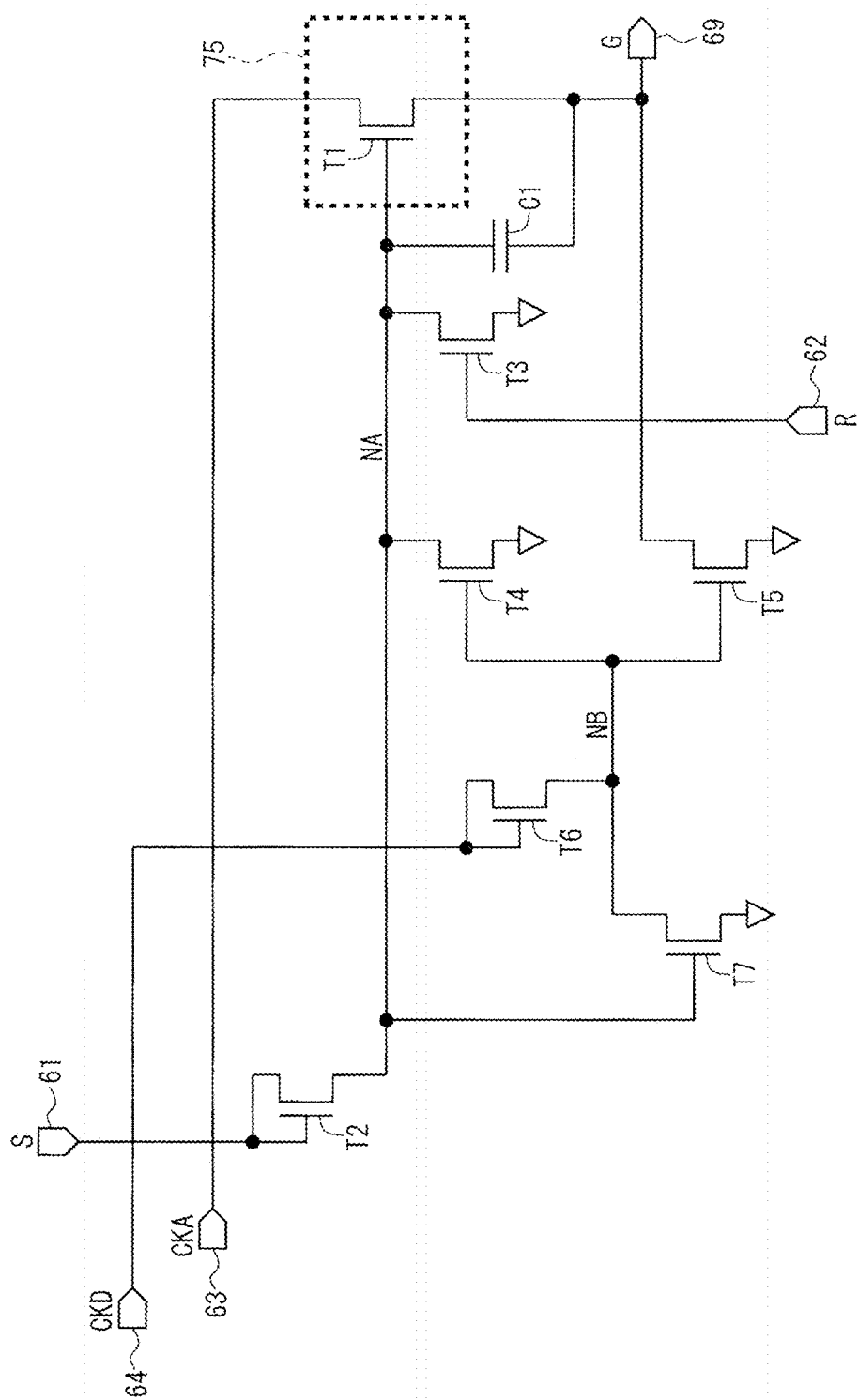
FIG. 11 is a diagram for describing the control of the light control panel in the first embodiment.
Figure 12:
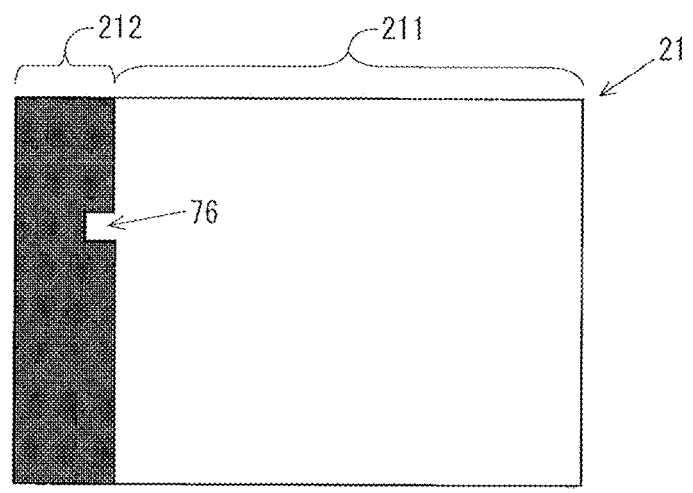
FIG. 12 is a diagram illustrating an example of a display pattern of the image display region in the light control panel in the first embodiment.

As described above, in the display panel 10, in a period (the period Tm in FIG. 10) in which an action for charging the gate bus line GL is performed in the unit circuit 121 and a period (the period Tn in FIG. 10) in which an action for discharging the gate bus line GL is performed in the unit circuit 121, light (light from the backlight) is radiated to only a region including the output control transistor T1 in the unit circuit 121 of the peripheral circuit region (a region denoted by a reference sign 75 in FIG. 11). At this time, the pattern image displayed on the image display region 21 in the light control panel 20 is, for example, as illustrated in FIG. 12. In FIG. 12, a region denoted by a reference sign 211 corresponds to the image display region 11 in the display panel 10, a region denoted by a reference sign 212 corresponds to a region where the gate driver 12 is formed in the display panel 10, and a region indicated by an arrow denoted by a reference sign 76 corresponds to a region where the output control transistor T1 is formed in the corresponding unit circuit 121.

Note that a shift action is performed in the gate driver 12, and thus, a region to which light is radiated in the region where the gate driver 12 is formed, moves little by little in response to the shift action. In order to implement this, the pattern image to be displayed on the image display region 21 in the light control panel 20 changes according to the action state of the gate driver 12.

Actions of the gate driver 12 and the source driver 13 in the display panel 10, and actions of the gate driver 22 and the source driver 23 in the light control panel 20 are controlled by the same display control circuit 40. Thus, a desired pattern image can be displayed on the image display region 21 in the light control panel 20 such that light is radiated to the region where the output control transistor T1 is formed in the unit circuit 121 in a corresponding manner to the period in which the gate bus line GL is charged or discharged in the unit circuit 121 (the period from the time point t02 to the time point t04 in FIG. 10).

Furthermore, using a mask layout appropriately designed in a manufacture process of the light control panel 20 allows light to be radiated to only a region where the output control transistor T1 is formed and no light to be radiated to a region other than the region in each unit circuit 121.

2.4 Effects

According to the present embodiment, the light control panel 20 is provided between the display panel 10 and the backlight 30. The image display region 21 in the light control panel 20 includes the region corresponding to the image display region 11 in the display panel 10, and the region corresponding to the region where the gate driver 12 is formed in the display panel 10. Then, according to the action state of the gate driver 12, the pattern image to be displayed on the image display region 21 in the light control panel 20 changes. Due to this, in the display panel 10, light is radiated to only the region where the output control transistor T1 corresponding to the gate bus line GL during being charged or discharged is formed in the region where the gate driver 12 is formed. In this way, the current drive capability of the output control transistor T1 is enhanced without causing an abnormal action due to a leakage current in the thin film transistor. As described above, according to the present embodiment, the liquid crystal display device capable of improving the capability of the thin film transistor in the monolithic peripheral circuit can be implemented.

3. Second Embodiment 3.1 Configuration

Figure 13:
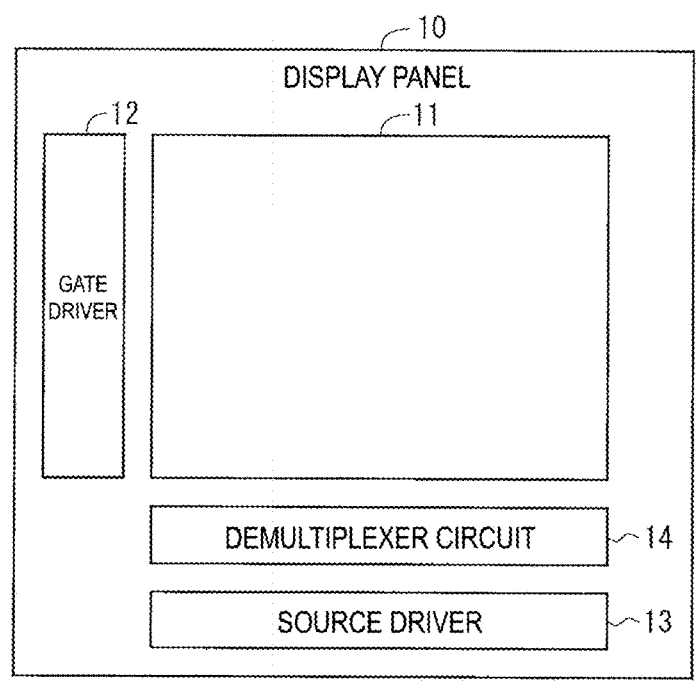
FIG. 13 is a block diagram illustrating a schematic configuration of a display panel according to a second embodiment.

FIG. 13 is a block diagram illustrating a schematic configuration of the display panel 10 according to a second embodiment. As illustrated in FIG. 13, in the present embodiment, a demultiplexer circuit 14 is provided between the image display region 11 and the source driver 13. The demultiplexer circuit 14 is formed directly on the substrate constituting the display panel 10. The connection switching circuit is implemented by the demultiplexer circuit 14.

The source driver 13 in the present embodiment outputs, in a time-division manner, a video signal for driving to a data output line corresponding to each source bus line group obtained by grouping a plurality of source bus lines into source bus line groups with two source bus lines SL as one set, during each horizontal scanning period. The demultiplexer circuit 14 supplies the video signal sent from the source driver 13 through each data output line to any of two source bus lines SL corresponding thereto. Although an example of the two source bus lines SL as one set is described here, the disclosure is not limited thereto, and a plurality of source bus lines SL may be grouped into source bus line groups with three or more source bus lines SL as one set.

Figure 14:
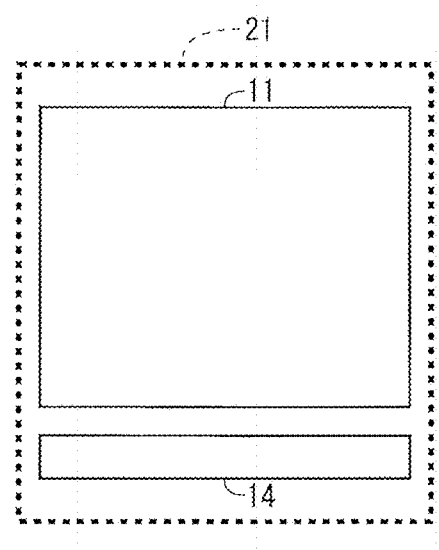
FIG. 14 is a diagram for describing an image display region in a light control panel in the second embodiment.

In the present embodiment, as illustrated in FIG. 14, the image display region 21 in the light control panel 20 includes the region corresponding to the image display region 11 in the display panel 10, and the region corresponding to the region where the demultiplexer circuit 14 is formed in the display panel 10. Note that the first region is implemented by the region corresponding to the image display region 11 in the display panel 10, and the second region is implemented by the region corresponding to the region in which the demultiplexer circuit 14 is formed in the display panel 10. Additionally, the peripheral circuit region is implemented by the region where the demultiplexer circuit 14 is formed in the display panel 10.

Figure 15:
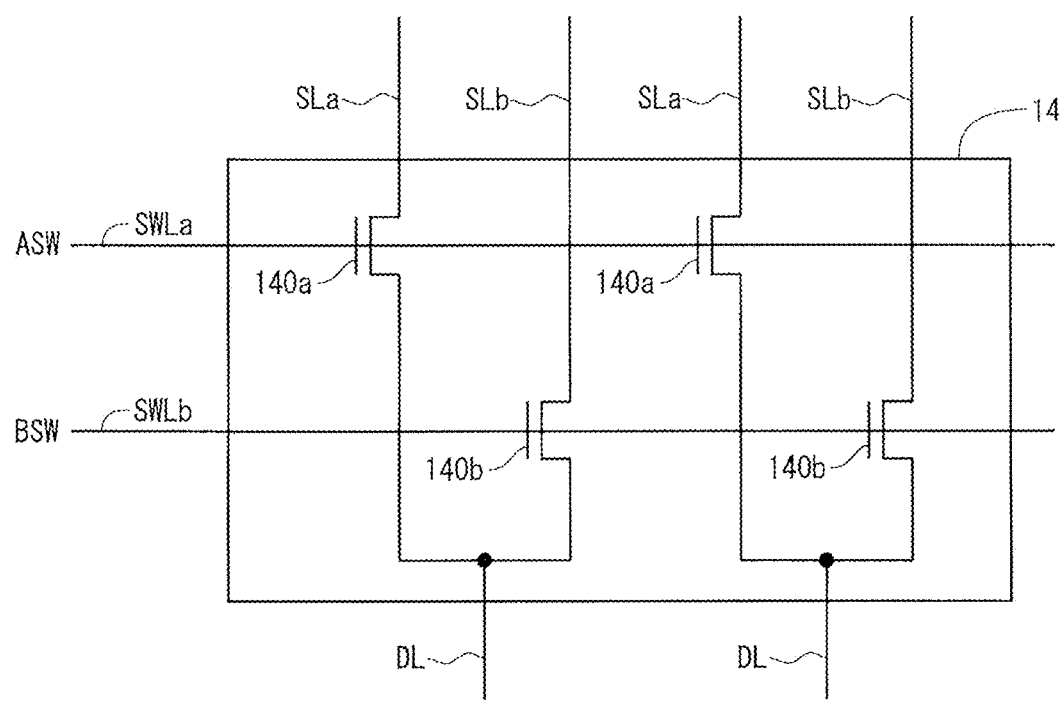
FIG. 15 is a circuit diagram illustrating a configuration example of a demultiplexer circuit in the second embodiment.

FIG. 15 is a circuit diagram illustrating a configuration example of the demultiplexer circuit 14 in the present embodiment. Note that FIG. 15 illustrates only a portion corresponding to two data output lines DL. The demultiplexer circuit 14 is provided with a first switching control signal ASW through a control signal line SWLa and is provided with a second switching control signal BSW through a control signal line SWLb. A first connection control transistor 140a and a second connection control transistor 140b are provided for each data output line DL. In this example, the first connection control transistor 140a and the second connection control transistor 140b are n-channel thin film transistors. For the first connection control transistor 140a, a control terminal is connected to the control signal line SWLa, a first conduction terminal is connected to the data output line DL, and a second conduction terminal is connected to an odd-numbered source bus line SLa. For the second connection control transistor 140b, a control terminal is connected to the control signal line SWLb, a first conduction terminal is connected to the data output line DL, and a second conduction terminal is connected to an even-numbered source bus line SLb. Note that the first switching control signal ASW and the second switching control signal BSW are output from the display control circuit 40 (see FIG. 3).

In the configuration described above, when the video signal is to be applied to the odd-numbered source bus line SLa, the display control circuit 40 sets the first switching control signal ASW to a high level and sets the second switching control signal BSW to a low level. This causes the first connection control transistor 140a to enter an on state and the second connection control transistor 140b to enter an off state, and thus the data output line DL is electrically connected to the odd-numbered source bus line SLa. Further, when the video signal is to be applied to the even-numbered source bus line SLb, the display control circuit 40 sets the first switching control signal ASW to a low level and sets the second switching control signal BSW to a high level. This causes the first connection control transistor 140a to enter the off state and the second connection control transistor 140b to enter the on state, and thus the data output line DL is electrically connected to the even-numbered source bus line SLb. As described above, a connection destination of each data output line DL is switched in a time-division manner in each horizontal scanning period between two source bus lines SLa and SLb.

Figure 16:
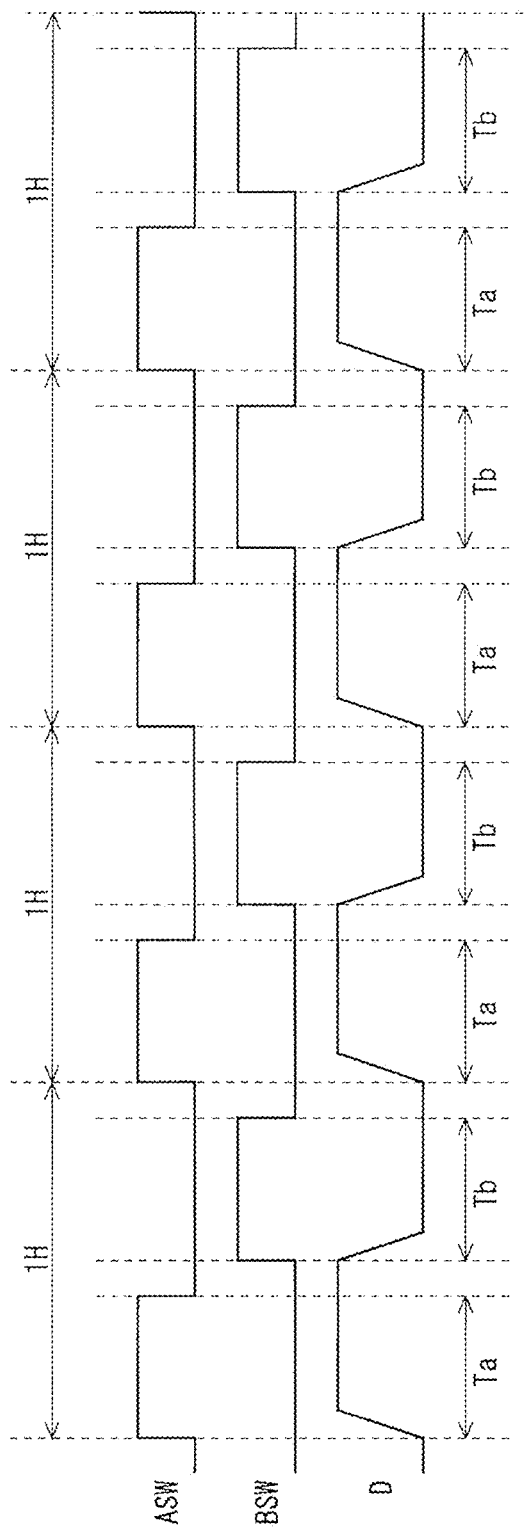
FIG. 16 is a signal waveform diagram for describing an action of the demultiplexer circuit in the second embodiment.

FIG. 16 is a signal waveform diagram for describing an action of the demultiplexer circuit 14. Note that in FIG. 16, one horizontal scanning period is represented as "1 H." As can be seen from FIG. 16, in each horizontal scanning period, the first switching control signal ASW is at a high level and the second switching control signal BSW is at a low level in a period Ta, and the first switching control signal ASW is at a low level and the second switching control signal BSW is at a high level in a period Tb. Thus, in the period Ta, each data output line DL is electrically connected to the odd-numbered source bus line SLa. As a result, the video signal is applied to the odd-numbered source bus line SLa in the period Ta. In addition, in the period Tb, each data output line DL is electrically connected to the even-numbered source bus line SLb. As a result, the video signal is applied to the even-numbered source bus line SLb in the period Tb.

3.2 Control of Light Control Panel

Figure 17:
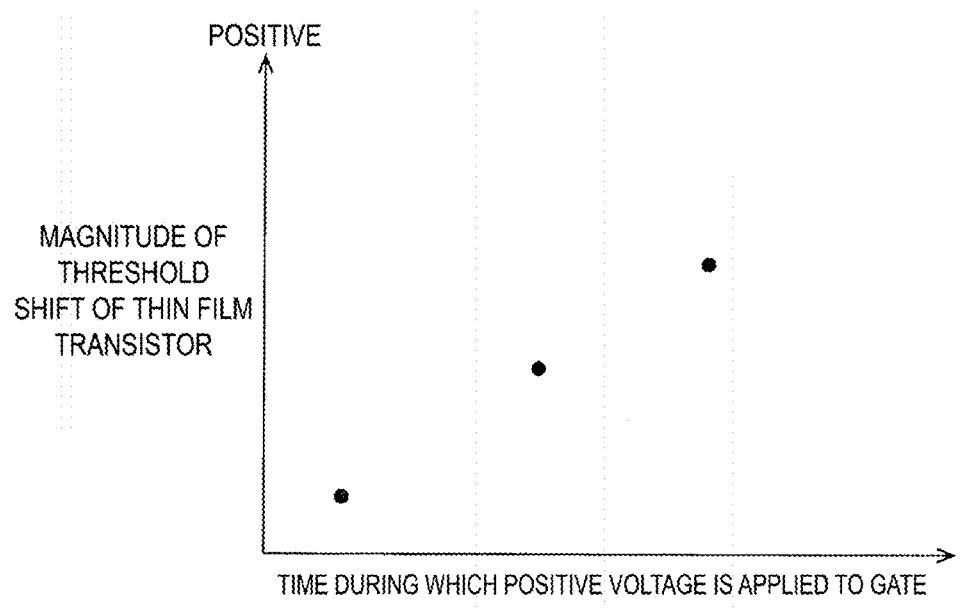
FIG. 17 is a diagram for describing a threshold shift of a transistor.
Figure 18:
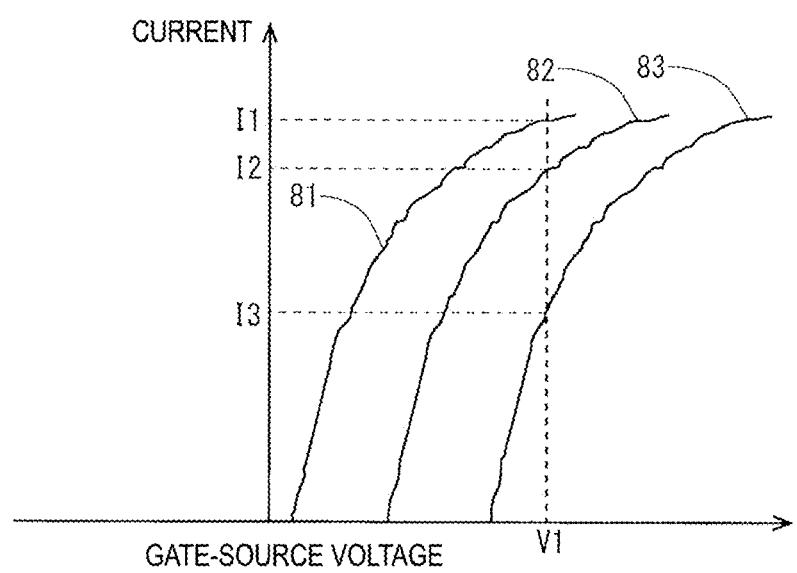
FIG. 18 is a diagram for describing the threshold shift of the transistor.

FIG. 17 shows a relationship between time during which a positive voltage is applied to a gate of a thin film transistor and a threshold shift (a change in threshold voltage) of the thin film transistor. As can be seen from FIG. 17, when the positive voltage is applied to the gate of the thin film transistor, a threshold shift in a positive direction occurs, and as the time during which the positive voltage is applied to the gate increases, the degree of the threshold shift in the positive direction increases. An effect of such a threshold shift will be described with reference to FIG. 18. Suppose that in an initial state of the thin film transistor, a relationship between a gate-source voltage and a current (flowing through the thin film transistor) is represented by a curved line denoted by a reference sign 81 in FIG. 18. In this initial state, when the gate-source voltage is V1, a magnitude of the current is I1. The application time of the positive voltage to the gate of the thin film transistor is accumulated, and thus the relationship between the gate-source voltage and the current is represented by a curved line denoted by a reference sign 82 in FIG. 18, for example. At this time, when the gate-source voltage is V1, the magnitude of the current is I2. I2 is smaller than I1. Furthermore, the application time of the positive voltage to the gate of the thin film transistor is accumulated, and thus the relationship between the gate-source voltage and the current is represented by a curved line denoted by a reference sign 83 in FIG. 18, for example. At this time, when the gate-source voltage is V1, the magnitude of the current is I3. I3 is smaller than I2. As described above, when a large threshold shift of the thin film transistor occurs, the current flowing through the thin film transistor largely decreases, significantly degrading the performance of the circuit using the thin film transistor.

As described above, in the present embodiment, the demultiplexer circuit 14 is provided between the image display region 11 and the source driver 13. In this regard, as can be seen from FIG. 16, the connection control transistors (the first connection control transistor 140a and the second connection control transistor 140b) in the demultiplexer circuit 14 are in the on state for a substantially half period of the whole time. Because of this, it is concerned that a large threshold shift in the positive direction occurs for the connection control transistor.

Figure 19:
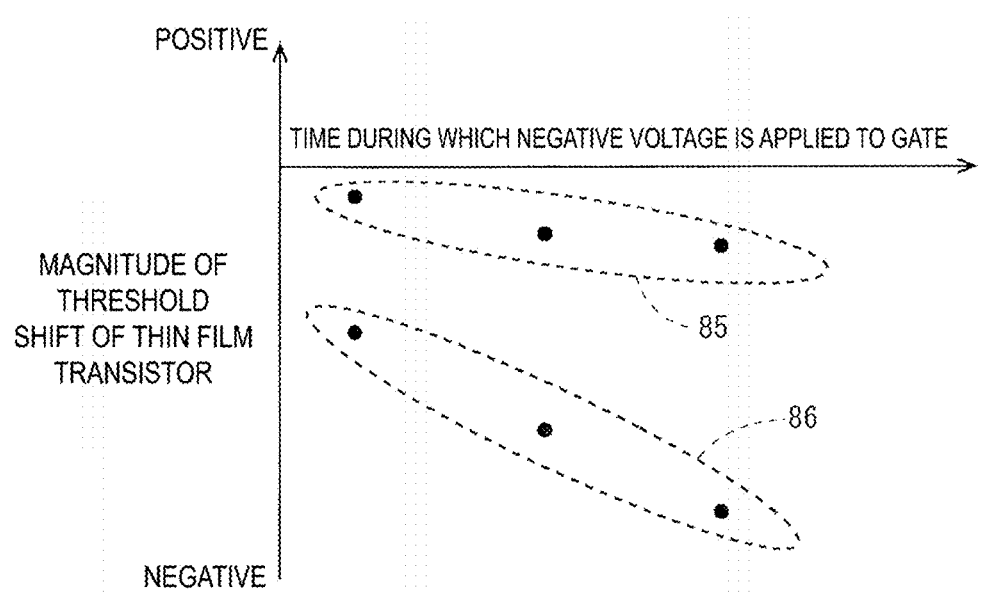
FIG. 19 is a diagram for describing the threshold shift of the transistor.

When a negative voltage is applied to a gate of a thin film transistor, a threshold shift in a negative direction occurs. Such a threshold shift will be described with reference to FIG. 19. FIG. 19 shows a relationship between time during which a negative voltage is applied to a gate of a thin film transistor and a threshold shift of the thin film transistor. The data in a dotted line denoted by a reference sign 85 in FIG. 19 is data obtained in a state where light from the backlight is not radiated to the thin film transistor, and the data in a dotted line denoted by a reference sign 86 in FIG. 19 is data obtained in a state where light from the backlight is radiated to the thin film transistor. It can be seen from FIG. 19 that compared to the case when light from the backlight is not radiated to the thin film transistor, the threshold shift in the negative direction is significantly large when the light from the backlight is radiated to the thin film transistor. That is, by applying the negative voltage to the gate of the thin film transistor while light from the backlight is radiated to the thin film transistor, a large threshold shift in the negative direction can be generated with respect to the thin film transistor.

Figure 20:
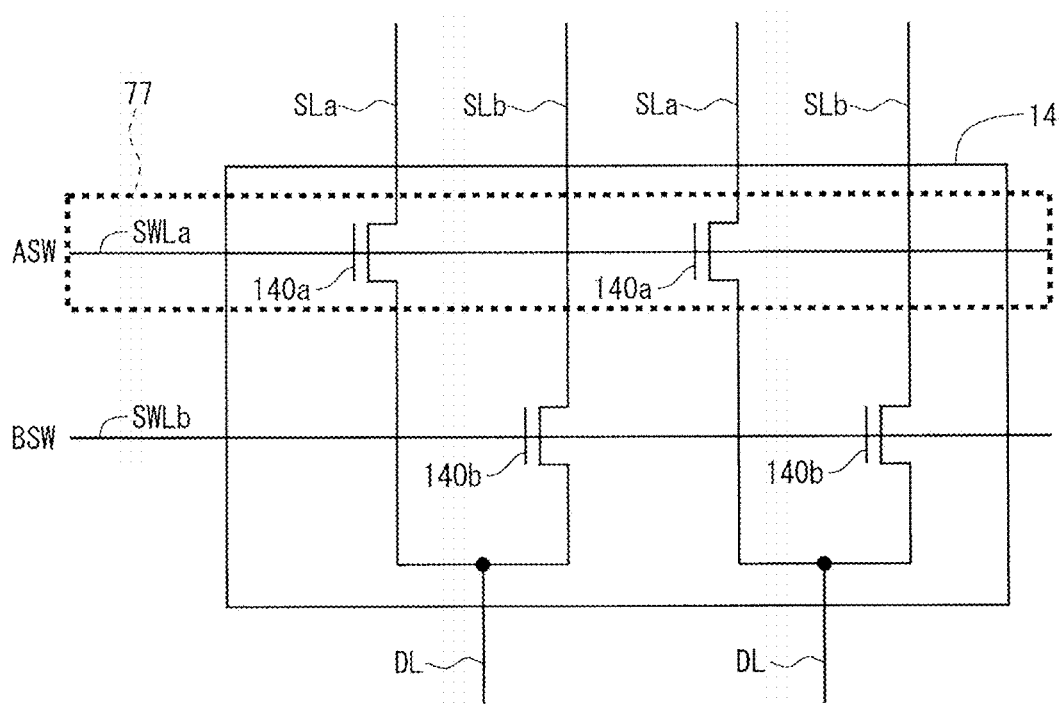
FIG. 20 is a diagram for describing the control of the light control panel in the second embodiment.
Figure 21:
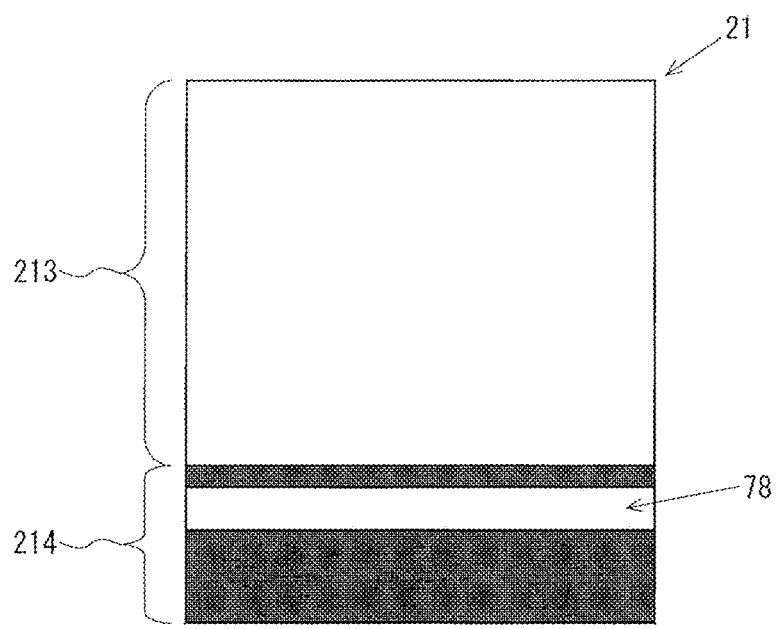
FIG. 21 is a diagram illustrating an example of a display pattern in the image display region in the light control panel in the second embodiment.

In view of the above, in the present embodiment, light is radiated to the connection control transistor that is in the off state (that is, the connection control transistor in which the negative voltage is applied to the gate thereof) in the demultiplexer circuit 14. Specifically, in a period when the first connection control transistor 140a is in the off state (a period other than the periods Ta in FIG. 16), light is radiated to the region where the first connection control transistor 140a is formed (a region denoted by a reference sign 77 in FIG. 20). At this time, the pattern image displayed on the image display region 21 in the light control panel 20 is, for example, as illustrated in FIG. 21. In FIG. 21, a region denoted by a reference sign 213 corresponds to the image display region 11 in the display panel 10, a region denoted by a reference sign 214 corresponds to a region where the demultiplexer circuit 14 is formed in the display panel 10, and a region indicated by an arrow denoted by a reference sign 78 corresponds to a region where the first connection control transistor 140a is formed. Similarly, in a period when the second connection control transistor 140b is in the off state (a period other than the periods Tb in FIG. 16), light is radiated to the region where the second connection control transistor 140b is formed.

As described above, the source bus lines SL are grouped into groups with two source bus lines as one set; however, no such limitation is intended. The source bus lines SL may be grouped into groups with three or more source bus lines SL as one set. In generalizing this, when K is an integer of 2 or greater, the pattern image is displayed on the image display region 21 in the light control panel 20 such that light emitted from the backlight 30 is radiated to the region in which the connection control transistor that is in the off state of the first to K-th connection control transistors is formed, and the light emitted from the backlight 30 in not radiated to the region in which the connection control transistor that is in the on state of the first to K-th connection control transistors is formed.

Note that in the present embodiment, a light radiation target region is implemented by the region in which the connection control transistors (the first connection control transistor 140a and the second connection control transistor 140b) are formed in the demultiplexer circuit 14.

3.3 Effects

According to the present embodiment, the light control panel 20 is provided between the display panel 10 and the backlight 30. The image display region 21 in the light control panel 20 includes the region corresponding to the image display region 11 in the display panel 10 and the region corresponding to the region where the demultiplexer circuit 14 is formed in the display panel 10. Then, according to the action state of the demultiplexer circuit 14, the pattern image to be displayed on the image display region 21 in the light control panel 20 changes. Specifically, the pattern image to be displayed on the image display region 21 in the light control panel 20 changes such that light is radiated to only the region where the connection control transistor that is in the off state in the demultiplexer circuit 14 is formed. This causes, for the connection control transistor, the threshold shift having a sufficient magnitude in the negative direction to occur in the period of the off state when the threshold shift in the positive direction occurs in the period of the on state. In this way, the threshold shift in the positive direction and the threshold shift in the negative direction of the connection control transistor are canceled, suppressing the change in characteristics of the connection control transistor. As described above, the present embodiment allows the liquid crystal display device capable of suppressing the change in characteristics of the thin film transistor in the monolithic peripheral circuit to be implemented.

4. Others

Although the disclosure has been described in detail above, the above description is exemplary in all respects and is not limited thereto. It is understood that numerous other modifications or variations can be made without departing from the scope of the disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A liquid crystal display device comprising:
a display panel; and
a backlight provided at a back face side of the display panel,
wherein the display panel includes
 an actual image display region on which an actual image is displayed, and
 a peripheral circuit region including a peripheral circuit configured to cause a circuit in the actual image display region to operate such that the actual image is displayed on the actual image display region,
the peripheral circuit is formed directly on a substrate constituting the display panel,
a light control panel including a pattern image display region is provided between the display panel and the backlight, the pattern image display region being a region including a first region corresponding to the actual image display region and a second region corresponding to the peripheral circuit region and a region on which a pattern image configured to control radiation of light emitted from the backlight to the display panel is displayed,
in the first region, white display is performed such that the light emitted from the backlight is radiated to the entirety of the actual image display region,
in the second region, white display is performed in a partial region of the peripheral circuit region such that the light emitted from the backlight is radiated to only the partial region, and black display is performed in a region other than the partial region, and
the partial region where the white display is performed and the region where the black display is performed in the second region change according to an action state of the peripheral circuit.

2. The liquid crystal display device according to claim 1, wherein the peripheral circuit region includes a plurality of light radiation target regions, and
the pattern image to be displayed on the pattern image display region changes according to the action state of the peripheral circuit such that the light emitted from the backlight is sequentially radiated to the plurality of light radiation target regions.

3. The liquid crystal display device according to claim 2, wherein each of the plurality of light radiation target regions is a region including a transistor.

4. The liquid crystal display device according to claim 3, wherein the actual image display region includes a plurality of scanning signal lines,
the peripheral circuit region includes, as the peripheral circuit, a scanning signal line drive circuit that is configured by a shift register formed of a plurality of stages corresponding one-to-one to the plurality of scanning signal lines and is configured to drive the plurality of scanning signal lines,
a unit circuit constituting each of the plurality of stages of the shift register includes a plurality of transistors, and
each of the plurality of light radiation target regions is a region including a predetermined transistor of the plurality of transistors included in the unit circuit.

5. The liquid crystal display device according to claim 4, wherein the shift register operates in response to a plurality of clock signals,
the unit circuit includes
an output node connected to a corresponding scanning signal line of the plurality of scanning signal lines, an output control transistor including a control terminal, a first conduction terminal to be provided with one of the plurality of clock signals, and a second conduction terminal connected to the output node,
an output control node connected to the control terminal of the output control transistor,
an output control node set section configured to set the output control node to an on level in response to an output signal output from the unit circuit constituting a preceding stage of the plurality of stages, and
an output control node reset section configured to set the output control node to an off level in response to an output signal output from the unit circuit constituting a succeeding stage of the plurality of stages, and
each of the plurality of light radiation target regions is a region including the output control transistor.

6. The liquid crystal display device according to claim 5, wherein the pattern image is displayed on the pattern image display region such that in each unit circuit, the light emitted from the backlight is radiated to the region including the output control transistor in a period when a corresponding scanning signal line of the plurality of scanning signal lines is to be charged and a period when the corresponding scanning signal line is to be discharged in a period when the output control node is maintained at the on level.

7. The liquid crystal display device according to claim 3, wherein the actual image display region includes a plurality of video signal lines,
the display panel includes a video signal line drive circuit configured to output, in a time-division manner, a video signal to a data output line corresponding to each video signal line group obtained by grouping the plurality of video signal lines into video signal line groups with K number of video signal lines as one set (K is an integer of 2 or greater),
the peripheral circuit region includes, as the peripheral circuit, a connection switching circuit configured to switch, in a time-division manner, a connection destination of the data output line corresponding to each video signal line group among the K number of video signal lines constituting each video signal line group,
the connection switching circuit includes first to K-th connection control transistors configured to control a connection state between the data output line corresponding to each video signal line group and each of the K number of video signal lines,
the plurality of light radiation target regions includes first to K-th light radiation target regions, and
the first to K-th light radiation target regions are regions including the first to K-th connection control transistors, respectively.

8. The liquid crystal display device according to claim 7, wherein the pattern image is displayed on the pattern image display region such that the light emitted from the backlight is radiated to a region including a connection control transistor that is in an off state of the first to K-th connection control transistors, and the light emitted from the backlight is not radiated to a region including a connection control transistor that is in an on state of the first to K-th connection control transistors.

9. The liquid crystal display device according to claim 1, further comprising
a light control panel drive circuit configured to cause a circuit in the pattern image display region to operate such that the pattern image is displayed on the pattern image display region, wherein an action of the peripheral circuit and an action of the light control panel drive circuit are controlled by the same control circuit.

10. A liquid crystal display device comprising:
a display panel; and
a backlight provided at a back face side of the display panel,
wherein the display panel includes
an actual image display region on which an actual image is displayed, and
a peripheral circuit region including a peripheral circuit configured to cause a circuit in the actual image display region to operate such that the actual image is displayed on the actual image display region,
the peripheral circuit is formed directly on a substrate constituting the display panel,
a light control panel including a pattern image display region is provided between the display panel and the backlight, the pattern image display region being a region including a first region corresponding to the actual image display region and a second region corresponding to the peripheral circuit region and a region on which a pattern image configured to control radiation of light emitted from the backlight to the display panel is displayed,
the peripheral circuit region includes a plurality of light radiation target regions, and
the pattern image to be displayed on the pattern image display region changes according to the action state of the peripheral circuit such that the light emitted from the backlight is sequentially radiated to the plurality of light radiation target regions.

11. The liquid crystal display device according to claim 10, wherein each of the plurality of light radiation target regions is a region including a transistor.

12. The liquid crystal display device according to claim 11, wherein the actual image display region includes a plurality of scanning signal lines,
the peripheral circuit region includes, as the peripheral circuit, a scanning signal line drive circuit that is configured by a shift register formed of a plurality of stages corresponding one-to-one to the plurality of scanning signal lines and is configured to drive the plurality of scanning signal lines,
a unit circuit constituting each of the plurality of stages of the shift register includes a plurality of transistors, and
each of the plurality of light radiation target regions is a region including a predetermined transistor of the plurality of transistors included in the unit circuit.

13. The liquid crystal display device according to claim 12, wherein the shift register operates in response to a plurality of clock signals,
the unit circuit includes
an output node connected to a corresponding scanning signal line of the plurality of scanning signal lines,
an output control transistor including a control terminal, a first conduction terminal to be provided with one of the plurality of clock signals, and a second conduction terminal connected to the output node,
an output control node connected to the control terminal of the output control transistor,
an output control node set section configured to set the output control node to an on level in response to an output signal output from the unit circuit constituting a preceding stage of the plurality of stages, and an output control node reset section configured to set the output control node to an off level in response to an output signal output from the unit circuit constituting a succeeding stage of the plurality of stages, and each of the plurality of light radiation target regions is a region including the output control transistor.

14. The liquid crystal display device according to claim 13, wherein the pattern image is displayed on the pattern image display region such that in each unit circuit, the light emitted from the backlight is radiated to the region including the output control transistor in a period when a corresponding scanning signal line of the plurality of scanning signal lines is to be charged and a period when the corresponding scanning signal line is to be discharged in a period when the output control node is maintained at the on level.

15. The liquid crystal display device according to claim 11, wherein the actual image display region includes a plurality of video signal lines, the display panel includes a video signal line drive circuit configured to output, in a time-division manner, a video signal to a data output line corresponding to each video signal line group obtained by grouping the plurality of video signal lines into video signal line groups with K number of video signal lines as one set (K is an integer of 2 or greater), the peripheral circuit region includes, as the peripheral circuit, a connection switching circuit configured to switch, in a time-division manner, a connection destination of the data output line corresponding to each video signal line group among the K number of video signal lines constituting each video signal line group, the connection switching circuit includes first to K-th connection control transistors configured to control a connection state between the data output line corresponding to each video signal line group and each of the K number of video signal lines, the plurality of light radiation target regions includes first to K-th light radiation target regions, and the first to K-th light radiation target regions are regions including the first to K-th connection control transistors, respectively.

16. The liquid crystal display device according to claim 15, wherein the pattern image is displayed on the pattern image display region such that the light emitted from the backlight is radiated to a region including a connection control transistor that is in an off state of the first to K-th connection control transistors, and the light emitted from the backlight is not radiated to a region including a connection control transistor that is in an on state of the first to K-th connection control transistors.

17. The liquid crystal display device according to claim 10, further comprising a light control panel drive circuit configured to cause a circuit in the pattern image display region to operate such that the pattern image is displayed on the pattern image display region, wherein an action of the peripheral circuit and an action of the light control panel drive circuit are controlled by the same control circuit.

* * * * *